United States Patent
Luo et al.

(10) Patent No.: US 9,520,885 B1
(45) Date of Patent: Dec. 13, 2016

(54) DIGITAL PHASE LOCKED LOOP (PLL) SYSTEM WITH FREQUENCY BAND JUMP IN LOCK MODE

(71) Applicant: GLOBALFOUNDRIES Singapore Pte. Ltd., Singapore (SG)

(72) Inventors: Zhihong Luo, Singapore (SG); Yi Liang, Singapore (SG); Qi Chen, Singapore (SG); Benjamin Shui Chor Lau, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/958,330

(22) Filed: Dec. 3, 2015

(51) Int. Cl.
*H03L 7/06* (2006.01)
*H03L 7/099* (2006.01)
*H03K 5/134* (2014.01)
*H03K 5/00* (2006.01)

(52) U.S. Cl.
CPC ............. *H03L 7/0992* (2013.01); *H03K 5/134* (2014.07); *H03K 2005/00058* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 6,356,158 B1 * | 3/2002 | Lesea | H03L 7/087 327/156 |
| 6,922,047 B2 * | 7/2005 | Knoll | H03L 7/0893 324/76.53 |
| 7,332,973 B2 | 2/2008 | Lee et al. | |
| 7,479,814 B1 | 1/2009 | Kaviani et al. | |
| 7,800,454 B2 | 9/2010 | Vanselow et al. | |
| 7,859,344 B2 * | 12/2010 | Uozumi | H03K 5/135 327/156 |
| 8,237,475 B1 * | 8/2012 | Nagarajan | H03L 7/0814 327/141 |
| 8,471,614 B2 | 6/2013 | Luo | |
| 8,604,852 B1 | 12/2013 | Turullols et al. | |
| 8,610,511 B1 * | 12/2013 | Elrabaa | H03K 3/0315 331/2 |
| 8,634,511 B2 | 1/2014 | Hong et al. | |
| 8,692,598 B2 | 4/2014 | Havens | |
| 2011/0089982 A1 | 4/2011 | Hsieh et al. | |
| 2011/0095794 A1 * | 4/2011 | Dubost | H03L 7/0805 327/158 |

(Continued)

OTHER PUBLICATIONS

United States Patent Office, U.S. Appl. No. 14/867,289, filed Sep. 28, 2015.

(Continued)

*Primary Examiner* — Adam Houston
(74) *Attorney, Agent, or Firm* — Lorenz & Kopf, LLP

(57) ABSTRACT

A phase locked loop (PLL) control system is provided that includes a digital controlled oscillator (DCO). The DCO comprises a delay cell chain comprising a number (B) of delay cells, and a load control cell comprising a number (L) of load cells. A system also includes that module that is configured to dynamically adjust the number (B) of delay cells that are activated and part of the delay cell chain and the number (L) of load cells that are switched on, when the PLL control system is operating in a lock mode, to control an amount of delay in the DCO.

19 Claims, 9 Drawing Sheets

(56) References Cited

U.S. PATENT DOCUMENTS

| | | | |
|---|---|---|---|
| 2011/0140747 A1* | 6/2011 | Endo | H03L 7/099 327/156 |
| 2012/0183104 A1 | 7/2012 | Hong et al. | |
| 2012/0319748 A1* | 12/2012 | Luo | H03L 7/085 327/158 |
| 2015/0008960 A1 | 1/2015 | Lahr | |

OTHER PUBLICATIONS

United States Patent Office, U.S. Appl. No. 14/867,298, filed Sep. 28, 2015.
USPTO, Notice of Allowance and Fee(s) Due for U.S. Appl. No. 14/867,289, mailed Sep. 9, 2016.
USPTO, Notice of Allowance and Fee(s) Due for U.S. Appl. No. 14/867,298 mailed Sep. 21, 2016.

* cited by examiner

DIGITAL PHASE LOCKED LOOP (PLL) SYSTEM WITH FREQUENCY BAND JUMP IN LOCK MODE

TECHNICAL FIELD

Embodiments of the subject matter described herein relate generally to phase locked loop (PLL) control, and more particularly, to a digital phase locked loop (PLL) system that implements frequency band jump control technique to keep the digital PLL system in lock mode over a wide frequency range even when temperature and supply voltage undergo large variations and vary over a wide range.

BACKGROUND

PLL control circuits are widely used in radio, telecommunications, computers and other electronic applications. They may generate stable frequencies, recover a signal from a noisy communication channel, or distribute clock timing pulses in digital logic designs such as microprocessors. Traditionally, the PLL circuit has been an analog block, including the basic components of a voltage control oscillator (VCO), phase and frequency detector (PFD), charge pump, low pass filter (LPF) and a feedback path. However, such analog PLL circuits include a number of capacitors that require a significantly large chip area. Additionally these circuits are very sensitive to power noise.

More recently, PLL circuit design has evolved to a greater use of digital control. The first generation digital PLL uses one external high frequency clock to sample the reference clock, then generates the output clock by dividing or multiplying a certain number according to requirement. The frequency of an external clock having accuracy required by such PLL circuits is limited with respect to its capability for applying a sampling rate that can accommodate high frequency reference clock signals. As this design can only be used in low frequency applications, a hybridization of analog and digital elements has been pursued. With such an approach, chip area has not been significantly reduced, while performance is markedly decreased.

A conventional digital PLL includes a digitally controlled oscillator (DCO). A conventional DCO includes a number of delay cells (e.g., buffers) and a number of load cells that are selectively activated and deactivated to control delay of the DCO loop by adjusting the number of delay cells that are active and the number of load cells that are switched on during any particular clock cycle. For example, the frequency of the DCO can be changed by digitally changing either the number of delay cells that are active or by changing the delay cell's loading by changing the number of load cells that are switched on during any particular clock cycle. This allows the DCO to provide two different types of delay adjustment.

A need exists for an improved PLL control system. It would be desirable if such an improved PLL control system can maintain lock status when temperature or supply voltage varies. Such a digital PLL circuit should also encompass a small chip area and exemplify other good performance capabilities. Furthermore, other desirable features and characteristics of the present invention will become apparent from the subsequent detailed description of the invention and the appended claims, taken in conjunction with the accompanying drawings and this background of the invention.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

BRIEF SUMMARY OF EMBODIMENTS

A phase locked loop (PLL) control system is provided that includes a digital controlled oscillator (DCO). The DCO comprises a delay cell chain comprising a number (B) of delay cells, and a load control cell comprising a number (L) of load cells. A system also includes that module that is configured to dynamically adjust the number (B) of delay cells that are activated and part of the delay cell chain and the number (L) of load cells that are switched on, when the PLL control system is operating in a lock mode, to control an amount of delay in the DCO.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
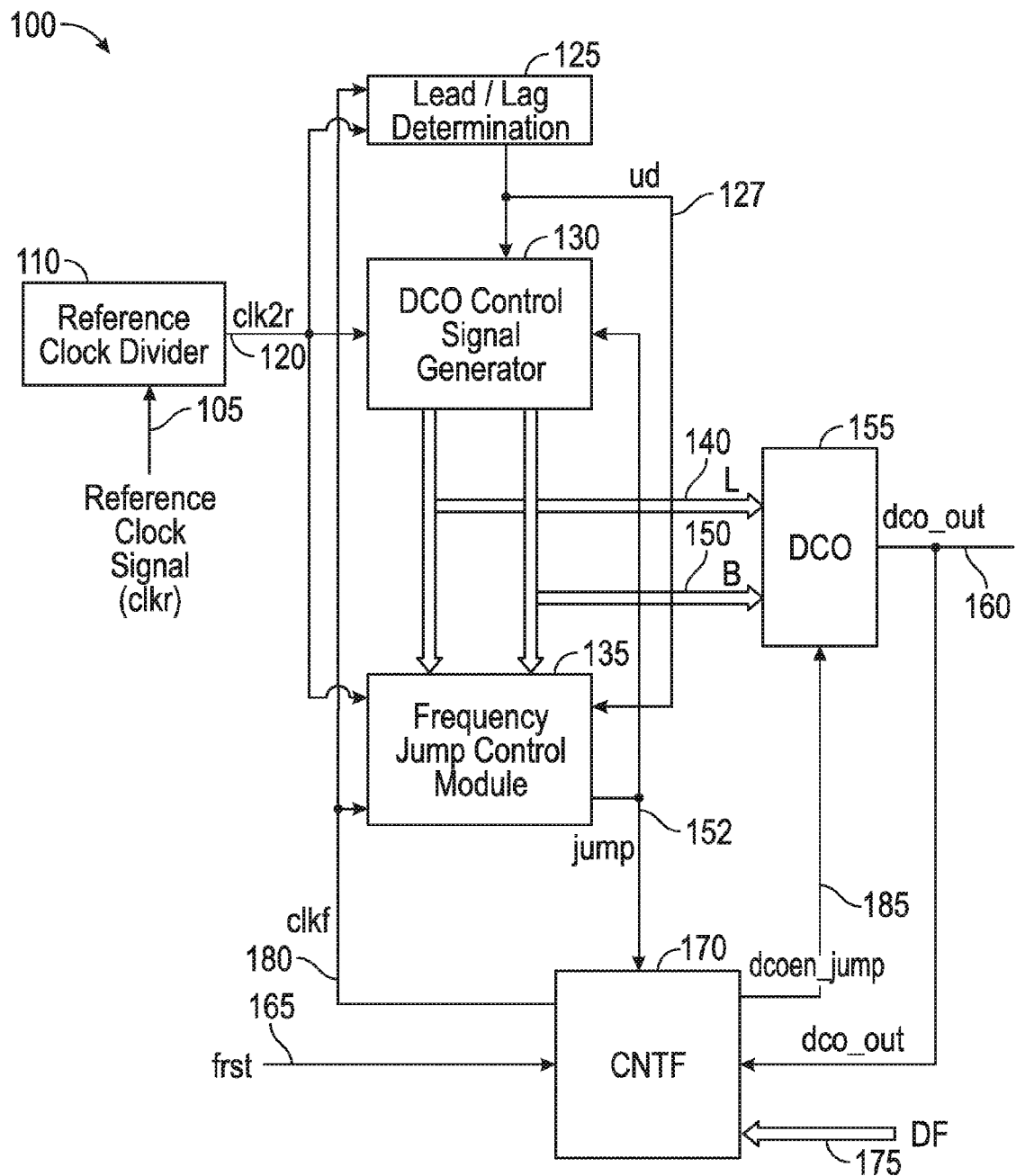
FIG. 1 is a block diagram of a PLL control system in accordance with the disclosed embodiments.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

The connecting lines shown in the various figures contained herein are intended to represent example functional relationships and/or physical couplings between the various elements. It should be noted that many alternative or additional functional relationships or physical connections may be present in an embodiment. As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The following description refers to elements or nodes or features being "connected" or "coupled" together. As used herein, unless expressly stated otherwise, "coupled" means that one element/node/feature is directly or indirectly joined to (or directly or indirectly communicates with) another element/node/feature, and not necessarily mechanically. Likewise, unless expressly stated otherwise, "connected" means that one element/node/feature is directly joined to (or directly communicates with) another element/node/feature, and not necessarily mechanically. In addition, certain terminology may also be used in the following description for the purpose of reference only, and thus are not intended to be limiting. For example, terms such as "first," "second," and other such numerical terms referring to elements or features do not imply a sequence or order unless clearly indicated by the context.

OVERVIEW

As noted above, a conventional PLL control system includes a DCO that includes a number of delay cells and a number of load cells that can be activated or inactivated during any particular cycle. Changing the number of delay cells causes relatively large changes in the loop delay in comparison to changing the number of load cells. Therefore, when a conventional digital PLL operates in lock mode, the number of delay cells is fixed (i.e., is not adjusted) because doing so can disrupt normal oscillation of the DCO and can cause the PLL to lose its lock status. In other words, when a conventional digital PLL is operating in lock mode, only the number of load cells is adjusted to avoid disrupting the oscillation of the DCO.

When temperature (or supply voltage) varies, the number of load cells that are active may decrease to a minimum value (i.e., 0) or a maximum value. One drawback of using the aforementioned delay adjustment strategy (i.e., only adjusting the number of load cells) is that it only works if the temperature and supply voltage vary over a relatively small range. However, when the temprature/supply voltage variation is large, the digital PLL can frequently lose its lock status and be forced to restart to regain lock status. These frequent changes between lock/unlock status can have a negative impact on the normal usage of the application that the digital PLL generates a clock for.

As such, it would be desirable to increase the PLL adjustment range when the PLL is operating in lock mode and increase the variation range of temperatures and supply voltages that the PLL can operate over without losing lock status. It would also be desirable to allow each cycle time of the output clock to exceed the expected cycle time of the output clock without negatively impacting functioning of the application. To explain further, the digital PLL generates a clock for an application that has a maximum working clock frequency. If the clock frequency is lower than the maximum working clock frequency, the application will work correctly, but if the clock frequency is higher than the maximum working clock frequency, the application may not work correctly.

In accordance with the disclosed embodiments, a digital PLL control system is provided in which the number of delay cells that are active in the DCO during any particular clock cycle can also be adjusted when the PLL is operating in lock mode (in addition to the number of load cells being adjusted). To avoid disrupting normal oscillation of the DCO, and causing the digital PLL to lose its lock status, a frequency band jump technique is implemented. After the adjustment of the number of load cells reaches a maximum and continues to increase, or reaches a minimum value and continues to decrease, the PLL will jump to another frequency band. As will be described in greater detail below, during the frequency band jump technique, the number of delay cells that are active will increase or decrease by one (1), and the number of load cells that are switched on will decrease or increase a certain number which approximately equals the delay of one delay cell plus an additional margin. After that (i.e., in subsequent cycles), the digital PLL will adjust the number of load cells that are switched on to make the frequency of the DCO output signal (dco_out) (also referred to herein as the DCO speed) match with the reference clock frequency. The digital PLL control system can maintain lock status during the frequency band jump technique despite adjusting the number of delay cells that are active in the DCO during any particular clock cycle.

Prior to describing one embodiment of a digital PLL control system that implements these techniques, definitions of variables or values that are used throughout the application are provided below.

The variable (B) designates the number of delay cells in the DCO delay loop that are activated during any particular cycle.

The variable (N) designates the total number of load cells in the DCO.

The variable (L) designates the number of the load cells in the DCO that are switched on during any particular cycle.

The variable (M) designates an equalized number of load cells that have a delay equivalent to one delay cell. In other words, the delay of one delay cell is designed to equal the delay of M load cells.

The variable (P) is an additional margin that is added to the adjustment of the variable (L) so that each cycle time of the high-frequency clock signal (dco_out) is larger than the expected cycle time of the high-frequency clock signal (dco_out). The cycle time of first cycle after system transitions from lock mode to the frequency-band jump mode is larger than previous cycle time.

FIG. 1 is a block diagram of a PLL control system 100 in accordance with the disclosed embodiments. The PLL control system 100 includes a reference clock divider 110, lead/lag determination circuitry 125, a DCO control signal generator 130, a frequency-band jump controller module 135, a digitally controlled oscillator (DCO) 155, and a synchronous high-speed counter 170. Although not illustrated for sake of brevity, conventional blocks such as a post divider can be included after the DCO 155 to process the DCO output signal (dco_out) 160 before it is provided to an application. FIG. 1 will be described with reference to FIGS. 2-11.

The PLL control system 100 receives a reference clock signal (clkr) 105 and produces a DCO output signal (dco_out) 160 that can be used to generate an output clock signal (not illustrated). The DCO output signal (dco_out) 160 is a high frequency clock signal output by the DCO 155 in response to various inputs received by the DCO 155.

Figure 2:
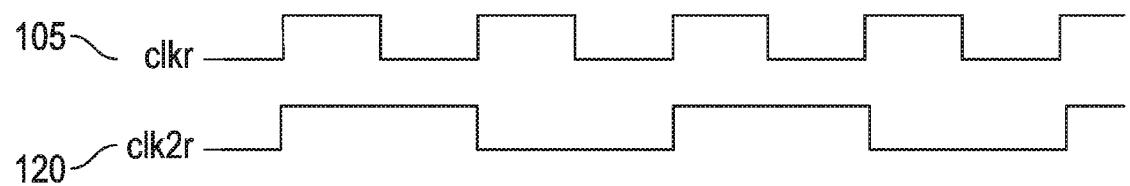
FIG. 2 is a waveform diagram illustrating a reference clock signal and a second clock signal in accordance with the disclosed embodiments.

The reference clock divider 110 is configured to receive the reference clock signal (clkr) 105, and based on the reference clock signal (clkr) 105, generate a second clock signal (clk2r) 120. The reference clock divider 110 divides the frequency the reference clock signal (clkr) 105 by 2 to produce the second clock signal (clk2r) 120 having a duty cycle of 50%. FIG. 2 is a waveform diagram illustrating the reference clock signal (clkr) 105 and the second clock signal (clk2r) 120 of the PLL control system 100 in accordance with the disclosed embodiments. The second clock signal (clk2r) 120 is the operating clock for the DCO control signal generator 130.

The lead/lag determination circuitry 125 is configured to receive the second clock signal (clk2r) 120 and the feedback clock signal (clkf) 180, and generate a lead/lag detection result 127 (UD) based on the second clock signal (clk2r) 120 and the feedback clock signal (clkf) 180. The lead/lag detection result (UD) 127 indicates whether the feedback clock signal (clkf) 180 leads or lags the second clock signal (clk2r) 120.

The frequency-band jump controller module 135 is configured to receive the second clock signal (clk2r) 120, the feedback clock signal (clkf) 180, the lead/lag detection result (UD) 127, a first digital control signal 140, and a second digital control signal 150. The frequency-band jump controller module 135 processes these inputs and when a value (L) of the first digital control signal 140 has reached a minimum value and has continued to decrease (at 312), or when the value (L) of the first digital control signal 140 has reached a maximum value and has continued to increase (at 314), the frequency-band jump controller module 135 the generates a frequency band jump signal 152. The operation of the frequency-band jump controller module 135 to generate the frequency band jump signal 152 will be described in greater detail below with reference to FIG. 8.

When an adjustment for the number (L) of load cells reaches a certain threshold (either a lower limit (zero) and continues to decrease or an upper limit (N) and continues to increase), the frequency band jump signal 152 is sent to the DCO control signal generator 130 to control the number (B) of delay cells in the loop such that the total delay increases as the number (B) of delay cells increases (and vice-versa), and to control the number (L) of load cells are switched on. The number (L) can be adjusted so that the PLL control system 100 "jumps" to another frequency band and the frequency (or "speed") of the DCO 155 matches the frequency of the reference clock (clk2r) 120. For example, if PLL feedback divide number (DF) 175 is equal to 100, the reference clock signal (clkr) 105 is equal to 10 Megahertz, and the high-frequency clock signal (dco_out) 160 is 1 gigahertz (10 Megahertz*100), then high-frequency clock signal (dco_out) 160 matches with the reference clock signal (clkr) 105.

The DCO control signal generator 130 receives the second clock signal (clk2r) 120 a lead/lag detection result (UD) 127 from the lead/lag determination circuitry 125, and the frequency band jump signal (jump) 152 from the frequency-band jump controller module 135, and processes these inputs to generate a first digital control signal 140 and a second digital control signal 150. The DCO control signal generator 130 can process the second clock signal (clk2r) 120, the lead/lag detection result 127 (UD) and frequency band jump signal 152 to dynamically adjust: the value (L) of the first digital control signal 140 to control the number (L) of load cells that are switched on to control an amount of delay of the DCO, and a value of the second digital control signal 150 to control the number (B) of delay cells that are active and part of the delay cell chain.

The high-frequency clock signal (dco_out) 160 is fed back to the synchronous high-speed counter 170. The synchronous high-speed counter 170 receives a reset signal (frst) 165 that resets the synchronous high-speed counter 170, the frequency band jump signal 152, PLL feedback divide number (DF) 175, and the high-frequency clock signal (dco_out) 160 from the DCO 155. Based on these inputs, the synchronous high-speed counter 170 performs processing to generate a feedback clock signal (clkf) 180. As an example, if the frequency of the DCO output signal (dco_out) 160 is 1 GHz, and the PLL feedback divide number (DF) 175 is equal to 100, then the feedback clock signal (clkf) 180 will turn-over every 100 cycle times of the DCO output signal (dco_out) 160, and the frequency of feedback clock signal (clkf) 180 will be around 5 MHz.

The DCO 155 receives the first digital control signal 140 and second digital control signal 150 along with a DCO enable signal (dcoen_jump) 185 from the synchronous high-speed counter 170. The DCO enable signal (dcoen_jump) 185 is kept high (logic 1) during lock mode, and it set low (logic 0) to reset the DCO loop (FIG. 5) and enable the DCO 155 to operate in frequency-band jump mode. These inputs are applied at the DCO 155 to generate a high-frequency clock signal (dco_out) 160 that is controlled based on these inputs. By adjusting/controlling the value (L) via the first digital control signal 140 and adjusting the value (B) via second digital control signal 150, the frequency of the high-frequency clock signal 160 output by the DCO 155 can be controlled (e.g., the cycle time ($T_{DCO}$) of the DCO 155 determines the frequency of the high-frequency clock signal 160). In general, the cycle time ($T_{DCO}$) of the DCO 155 will be at its expected value when the cycle time ($T_{clkf}$) of the feedback clock signal (clkf) 180 substantially matches the cycle time ($T_{clk2r}$) of the second clock signal (clk2r) 120.

Figure 3:
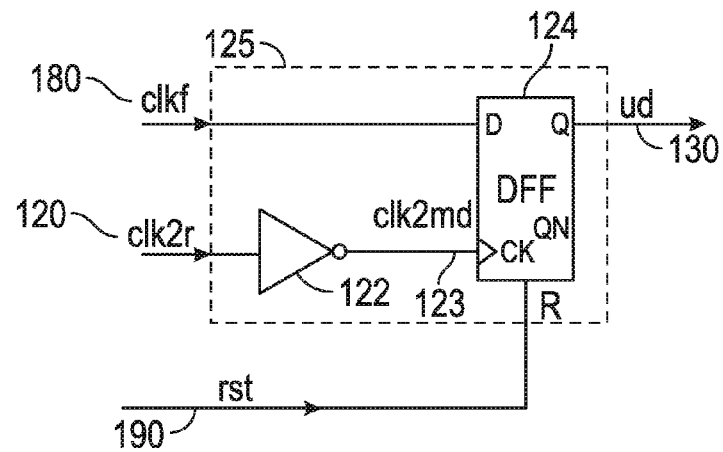
FIG. 3 is a block diagram of the lead/lag determination circuitry in accordance with one exemplary implementation of the disclosed embodiments.

FIG. 3 is a block diagram of the lead/lag determination circuitry 125 in accordance with one exemplary implementation of the disclosed embodiments. As illustrated in FIG. 3, the lead/lag determination circuitry 125 includes an inverter 122 and a D flip-flop 124. The inverter 122 receives and inverts the second clock signal (clk2r) 120 to generate an inverted version of the second clock signal (clk2rnd) 123. The D flip-flop 124 is receives the feedback clock signal (clkf) 180 and the inverted version of the second clock signal (clk2rnd) 123 and a reset signal 190. Based on the inverted version of the second clock signal (clk2rnd) 123 and the feedback clock signal (clkf) 180, the D flip-flop 124 generates the lead/lag detection result 127 (UD).

Figure 4:
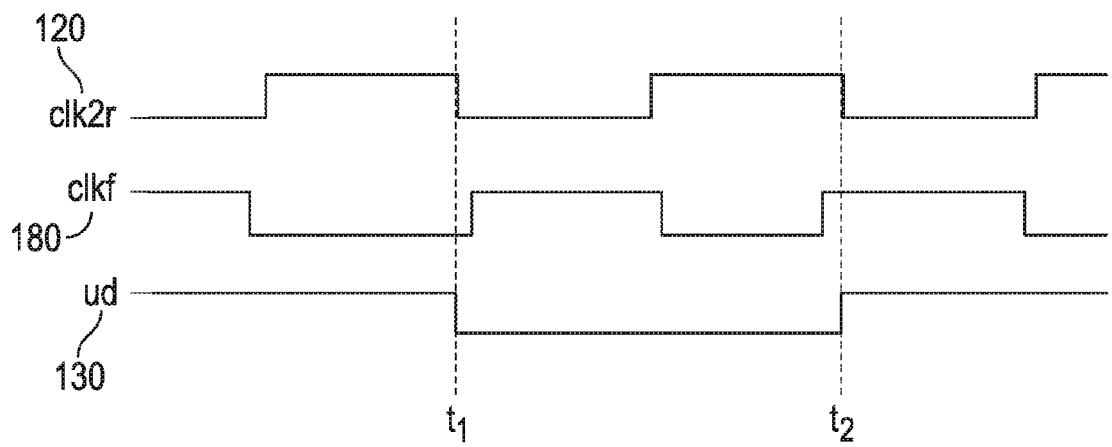
FIG. 4 is a waveform diagram illustrating a second clock signal, a feedback clock signal and a lead/lag detection result in accordance with the disclosed embodiments.

FIG. 4 is a waveform diagram illustrating the second clock signal (clk2r) 120, the feedback clock signal (clkf) 180 and the lead/lag detection result 127 (UD) of the PLL control system 100 in accordance with the disclosed embodiments. As illustrated in FIG. 4, in this particular example, at time t1, the feedback clock signal (clkf) 180 lags the second clock signal (clk2r) 120 by a certain amount such that the lead/lag detection result 127 (UD) is low (e.g., has a logical zero value) to indicate a lag detection result. By contrast, at time t2, the feedback clock signal (clkf) 180 leads the second clock signal (clk2r) 120 by a certain amount such that the lead/lag detection result 127 (UD) is high (e.g., has a logical one value) to indicate a lag detection result Referring again to FIG. 1, in normal lock mode, the DCO enable signal (dcoen_jump) 185 stays high (logic one (1)) and the DCO 155 keeps oscillating continuously. The DCO enable signal (dcoen_jump) 185 is set low (logic (0)) to reset the DCO loop (FIG. 5) and enable the DCO 155 to operate in frequency-band jump mode. When the frequency band jump signal 152 goes high (logic one (1)), the frequency-band jump mode starts, and the DCO 155 keeps oscillating until the synchronous high-speed counter 170 counts to PLL feedback divide number (DF) 175, at which point feedback clock signal (clkf) 180 goes high (set to logic 1) and DCO enable signal (dcoen_jump) 185 goes low (is set to logic 0 immediately before the next falling edge of the high-frequency clock signal (dco_out) 160) to reset the DCO loop (FIG. 5) and make the DCO 155 stop oscillating while the last cycle of the high-frequency clock signal (dco_out) 160 completes. This ensures that the actual cycle time during each cycle of the high-frequency clock signal (dco_out) 160 is larger than the expected cycle time of the high-frequency clock signal (dco_out) 160 with no impact on the application function.

Then, when the first rising edge of high-frequency clock signal (dco_out) 160 arrives, the synchronous high-speed counter 170 and the feedback clock signal (clkf) 180 will be reset. After the rising edge of the second clock signal (clk2r) 120, the DCO enable signal (dcoen_jump) 185 switches high (logical one (1)) and the DCO 155 starts oscillating again.

Figure 5A:
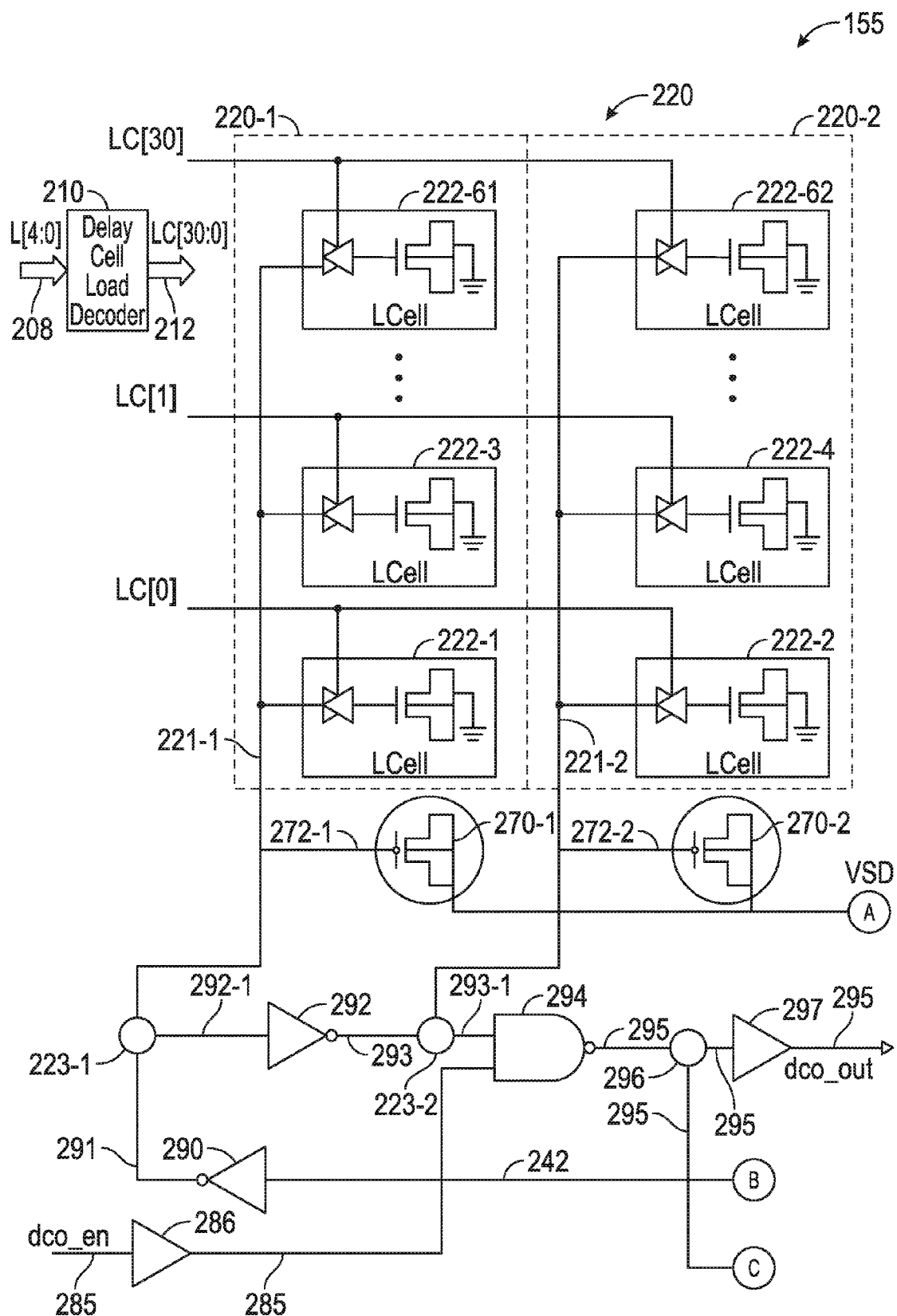
FIGS. 5A and 5B collectively illustrate a schematic representation of an exemplary digital controlled oscillator (DCO) in accordance with the disclosed embodiments.
Figure 5B:
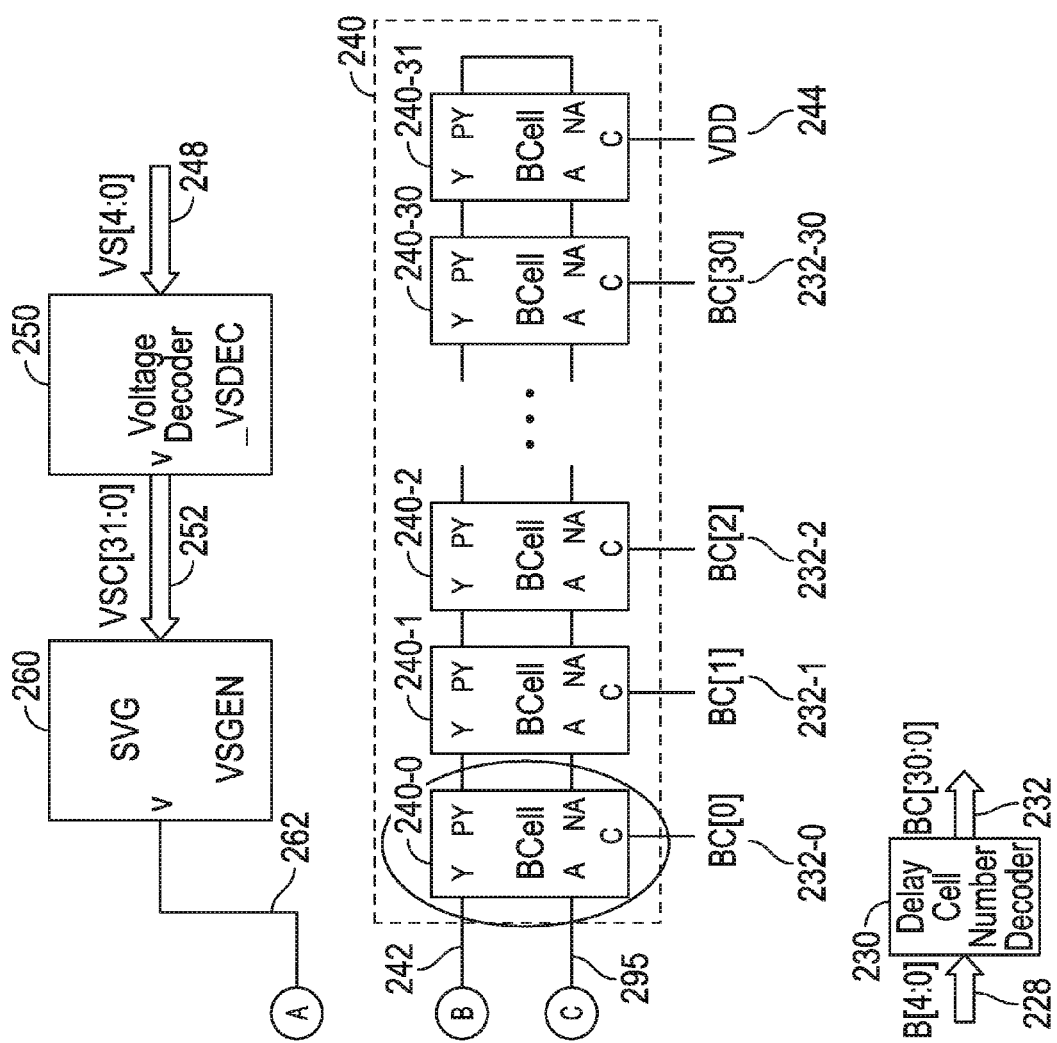

FIGS. 5A and 5B collectively illustrate a schematic representation of an exemplary digital controlled oscillator (DCO) 155 that can be implemented in the PLL control system 100 of FIG. 1. The DCO 155 includes a load control decoder 210, a load control cell 220, a delay cell number decoder 230, a delay cell chain 240, a voltage decoder 250, a substrate voltage generator 260, capacitance elements 270-1, 270-2, a buffer 286 that receives an enable signal (dco_en) 285 that enables or disables the DCO 155, load adjustment delay cells 290, 292 (referred to herein as a first load adjustment delay cell 290 and a second load adjustment delay cell 292), a NAND gate 294, and a buffer 297.

The load control cell 220 includes an array of load cells 222. The array of load cells 222 includes a first set 220-1 of the load cells and a second set 220-2 of the load cells. Each of the array of load cells 222 are grouped in pairs such that one of the first set 220-1 of the load cells is paired with one of the second set 220-2 of load cells.

The first load adjustment delay cell 290 and the second load adjustment delay cell 292 are always in the delay loop of the DCO. Their load can be adjusted. For example, in one implementation, when one of the load adjustment delay cells is switched on the delay (attributable to the first load adjustment delay cell 290 and the second load adjustment delay cell 292) can change by 3 picoseconds (e.g., from 30 picoseconds to 33 picosecond).

The load control decoder 210 can generate a load control signal 212 that is applied to the load control cell 220 to control loading of the first load adjustment delay cell 290 and the second load adjustment delay cell 292. The load control signal 212 includes a set of binary values (LC [30:0]) that are applied to the first set 220-1 and the second set 220-2 of the load cells such that each particular pair of load cells 222 is configured to receive a particular binary value from the load control signal 212 (e.g., 31 values in the exemplary implementation illustrated) that are applied to an array of load cells 222 (e.g., 62 load cells). In other words, each load cell in a particular pair of load cells 222 receives the same value from the load control (LC[x]) signal 212. The odd numbered load cells 222 contribute to the voltage at node 223-1 and the even numbered load cells 222 contribute to the voltage at node 223-2.

The first set 220-1 of the load cells 222 output a first load signal 221-1 to control an amount of loading on the second load adjustment delay cell 292. The second set 220-2 of the load cells 222 output a second load signal 221-2 to control an amount of loading on the first load adjustment delay cell 290. By changing the number of load cells switched on, this configuration allows the loading of the second load adjustment delay cell 292 and the first load adjustment delay cell 290 to be changed linearly thereby allowing the DCO cycle time to be changed linearly via the load control signal 212 depending on the number of load cells switched on at any given time.

Figure 6:
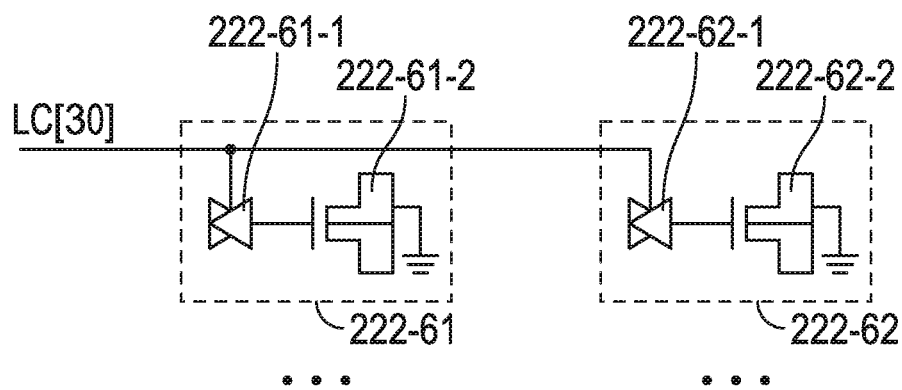
FIG. 6 is a schematic diagram that shows a pair of load cells from FIG. 5A in accordance with one exemplary implementation of the disclosed embodiments.

FIG. 6 is a schematic diagram that shows a pair of load cells 222 from FIG. 5A, specifically load cell pair 222-61 and 222-62 of FIG. 5A. Each of the load cells 222-61, 222-62 in FIG. 6 includes MOS capacitor 222-61-2, 222-62-2 that is coupled between a pass gate 222-61-1, 222-62-1 of that particular load cell and ground. In each particular pair of load cells (e.g., FIG. 6), each pass gate 222-61-1, 222-62-1 receives a binary value of the load control signal 212. The load contribution of each load cell is controllable based on the binary value of the load control signal 212 such that the MOS capacitor will not contribute to the total load on a first node 223-1 and a second node 223-2 when the binary value of the load control signal 212 has a first value and the pass gate is off, and such that the MOS capacitor will contribute to the total load on the first node 223-1 and the second node 223-2 when the binary value of the load control signal 212 has a second value and the pass gate is on. If this control signal (LC[x]) is '0', then this pass gate is off, and the MOS capacitor will not contribute to the total load of node 223-1 and 223-2 (e.g., the load contribution of this load cell includes only the capacitance of the pass gate). If this control signal (LC[x]) is '1', then this pass gate is on, and the MOS capacitor will contribute to the total load of node 223-1 and 223-2, and make a delay incremental on the delay of the DCO loop (FIG. 5) (e.g., the total load contribution of this load cell includes both the capacitance of the pass gate and the capacitance of the MOS capacitor). As such when the control pin is switched on or off by control signal (LC[x]), there will be a fixed delta load change.

Based on a number command signal 228, the delay cell number decoder 230 can generate a delay cell number control vector 232 that includes a set of binary values BC [30:0] (e.g., 31 values in the exemplary implementation illustrated). The number command signal 228 is a 5-bit binary control signal that is processed by the delay cell number decoder 230 to generate the delay cell number control vector 232.

The delay cell chain 240 is coupled to node 296 and to an input of the first load adjustment delay cell 290. The delay cell chain 240 includes a set of selectable delay cells 240-0 . . . 240-31 (e.g., 31 load cells) that are coupled to each other in series. The delay cell number control vector 232 is applied to the delay cell chain 240. In response to the delay cell number control vector 232 and DCO output signal (dco_out) 295 from the NAND gate 294, the delay cell chain 240 generates a delay cell output signal 242. Each of the delay cells 240-0 . . . 240-31 has the same delay (e.g., approximately 60 picoseconds in one implementation), and they can be included in the DCO delay loop or excluded from the DCO delay loop of the delay cell chain 240. The values of the delay cell number control vector 232 are used to change the number of delay cells 240-0 . . . 240-31 that are included in the delay loop of the DCO 155. To explain further, the delay cell number control vector 232 includes a set of binary values BC [30:0] (e.g., 31 values in the exemplary implementation illustrated) that are applied to the set of selectable delay cells 240, except for the last selectable delay cell 240-31 in the chain since a first supply voltage (VDD) 244 is applied to the last selectable delay cell 240-31 in the chain. Each of the selectable delay cells 240-0 . . . 240-30 receives a particular binary value of the delay cell number control vector 232 to the number of the selectable delay cells 240-0 . . . 240-31 that are part of the delay cell chain 240. In other words, by varying the values BC[30:0] of the delay cell number control vector 232, the number of delay cells 240 that are part of the delay cell chain 240 (and that contribute to a total loop delay of the DCO 155) can be tuned. The delay cell output signal 242 changes based on the number of the selectable delay cells 240-0 . . . 240-31 that are part of the delay cell chain 240.

Figure 7:
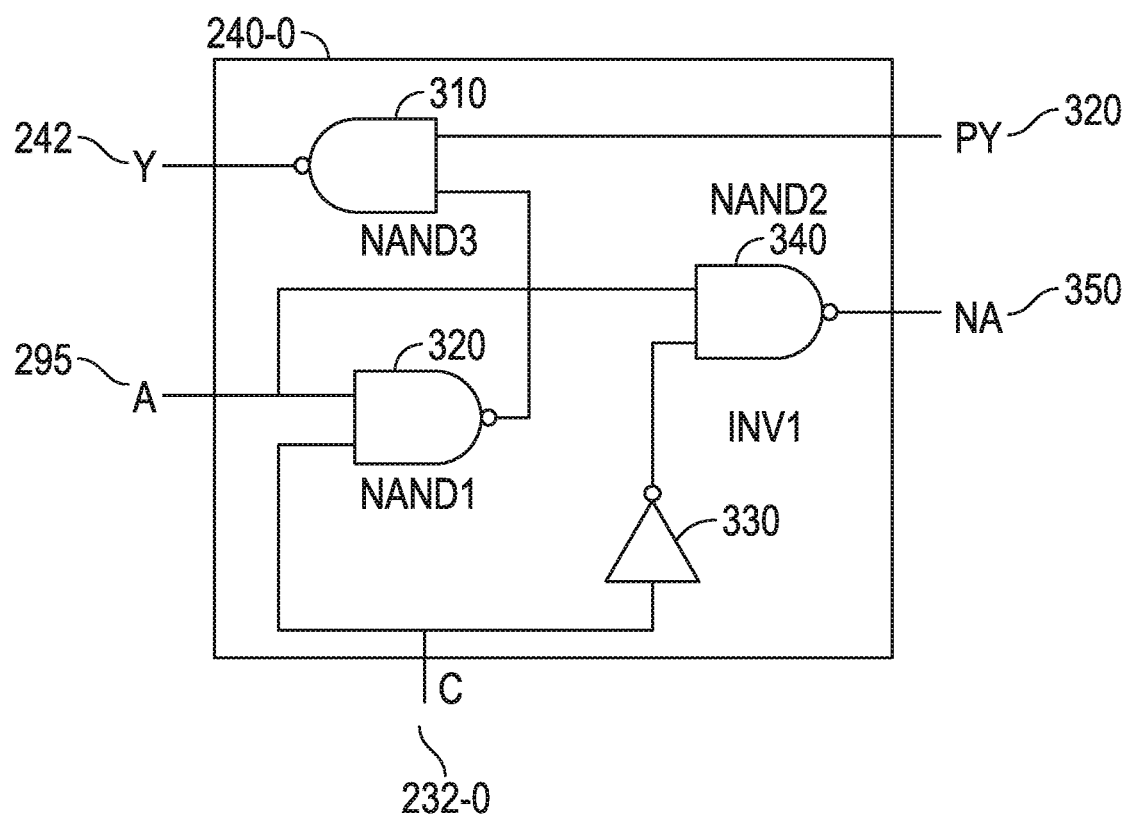
FIG. 7 is a schematic diagram that shows one delay selectable cell in accordance with one exemplary implementation of the disclosed embodiments.

To explain further, FIG. 7 shows the schematic of one selectable delay cell 240-0 that includes three NAND gates 310, 320, 240 and one inverter 330. As illustrated in FIG. 7, the selectable delay cell 240-0 receives the delay cell number control vector 232-0 BC[0] from the delay cell number decoder 230 at a first input (C). When the value of BC[0] is equal to binary 0, then delay cell 240-0 is part of the delay chain that contributes to the DCO output signal (dco_out) 295. However, when BC[0] is equal to binary 1, then selectable delay cell 240-0 is not part of the delay chain that contributes to the DCO output signal (dco_out) 295. The selectable delay cell 240-0 receives a value from the delay cell number control vector 232-0 BC[0] at a first input (C) and the DCO output signal (dco_out) 295 at a second input (A), and a 320 at another input (PY). The selectable delay cell 240-0 then outputs the delay cell output signal 242 (at Y) and a 350 (at NA). When C is '1', NAND gate 340 is blocked and NAND gate 320 is unblocked. Input PY is from next delay cell, can be configured to '1'. The delay from 'A' to 'Y' is the delay attributable to two NAND2 cells, and the delay of other delay cells (followed this delay cell) have no contribution to the total loop delay of the DCO. By contrast, when C is '0', NAND gate 320 is blocked and NAND gate 340 is unblocked, and NAND gate 310 is unblocked. As such, the delay contribution of selectable delay cell 240-0 to the total loop delay is also the delay attributable to two NAND2 cells, but the followed delay cell's delay that will also contribute to the total loop delay of the DCO.

Thus, if the values of the delay cell number control vector 232 BC[30:0] are controlled in the format of "11 . . . 1100 . . . 00" (from bit 30 to bit N are all '1', from bit N−1 to bit 0 are all '0'), then the total delay cells chain delay contribution to the loop delay of the DCO is N*BD, where BD is the cell delay of one delay cell, which is around 2 times NAND2 cell's delay.

The voltage decoder 250 generates values of a substrate voltage command signal 252 in response to a voltage command vector 248. In one non-limiting implementation, shown below in Table 1, the voltage command vector 248 (labeled VS[4:0]) can be, for example, a 5-bit binary control vector that is processed by the voltage decoder 250 to generate a substrate voltage command signal 252 that includes a plurality of binary values (VSC[0] . . . VSC[31]).

TABLE 1

| VS | VSC |
|---|---|
| 00000 | 0000000000 . . . 000001 |
| 00001 | 0000000000 . . . 000010 |
| 00010 | 0000000000 . . . 000100 |
| 00011 | 0000000000 . . . 001000 |
| 00100 | 0000000000 . . . 010000 |
| 00101 | 0000000000 . . . 100000 |
| . . . | . . . |
| 11110 | 0100000000 . . . 000000 |
| 11111 | 1000000000 . . . 000000 |

In this implementation, the substrate voltage command signal 252 includes 32 binary values VSC[0] . . . VSC[31] that are supplied as inputs 252 to the substrate voltage generator 260. In response to the substrate voltage command signal 252, the substrate voltage generator 260 generates a control signal (VSD) 262.

The first and second capacitance elements 270-1, 270-2 are coupled to the substrate voltage generator 260. The first and second capacitance elements 270-1, 270-2 each have a substrate voltage that is adjustable in response to the control signal (VSD) 262. The control signal (VSD) 262 adjusts substrate voltages of the first and second capacitance elements 270-1, 270-2 to control a first output voltage 272-1 of the first capacitance element 270-1 and a second output voltage 272-2 of the second capacitance element 270-2 to adjust loading in the DCO 155. In one implementation, the first and second capacitance elements 270-1, 270-2 can be implemented using transistors 270 configured to function as capacitors 270. In that implementation, the control signal (VSD) 262 can be applied at source and drain regions of the transistors 270-1, 270-2 to control a substrate voltage that is applied at the source and drain regions of the transistors 270-1, 270-2 such that a load on the DCO is adjustable. In one implementation, the transistors 270-1, 270-2 can be p-type metal oxide semiconductor (PMOS) field-effect transistors (FETS) 270 that are configured to function as PMOS capacitors 270. In one exemplary implementation, the transistors 270-1, 270-2 can be low-voltage threshold (LVT) PMOSFETs having a capacitance that changes almost linearly when the control signal (VSD) 262 varies within a range from 0.5 volts to 1.2 volts to change the substrate voltage. By controlling the substrate voltages of the PMOS capacitors 270-1, 270-2, the average capacitance of the PMOS capacitors 270-1, 270-2 can be changed which, in turn, allows the load on the entire DCO to be adjusted. By utilizing a pair of PMOS capacitances (and a first set 220-1 and second set 220-2 of the load cells), the rising edge and falling edge of the DCO output signal (dco_out) 295 can be balanced.

The second load adjustment delay cell 292 is coupled between a first node 223-1 and a second node 223-2. The first load signal 221-1 is applied at the first node 223-1 and the second load signal 221-2 is applied at the second node 223-2.

The first load adjustment delay cell 290 receives the delay cell output signal 242 from the delay cell chain 240, and inverts the delay cell output signal 242 to generate an inverted delay cell output signal 291 that is provided to the first node 223-1 along with the first load signal 221-1 from the first set 220-1 of the load cells and a first output voltage 272-1 from the first capacitance element 270-1 to generate a first combined signal 292-1.

The second load adjustment delay cell 292 inverts the first combined signal 292-1 to generate a first inverted output signal 293. The second node 223-2 outputs a second combined signal 293-1 based on the second load signal 221-2 from the second set 220-2 of the load cells, a second output voltage 272-2 from the second capacitance element 270-2, and the first inverted output signal 293.

The NAND gate 294 is coupled between node 223-2 and node 296. The NAND gate 294 includes a first input that receives the second combined signal 293-1, and a second input that receives the enable signal (dco_en) 285 from buffer 286. The NAND gate 294 performs a logical NAND operation on the enable signal (dco_en) 288 and the second combined signal 293-1 to generate the DCO output signal (dco_out) 295 that is sent (through node 296) to the buffer 297. The buffer 297 outputs the DCO output signal (dco_out) 295. The DCO output signal (dco_out) 160 can be provided as a clock for various applications such as, for example, system-on-a chip (SOC) clocks used in communication applications, consumer applications, computer applications, etc.

Figure 8:
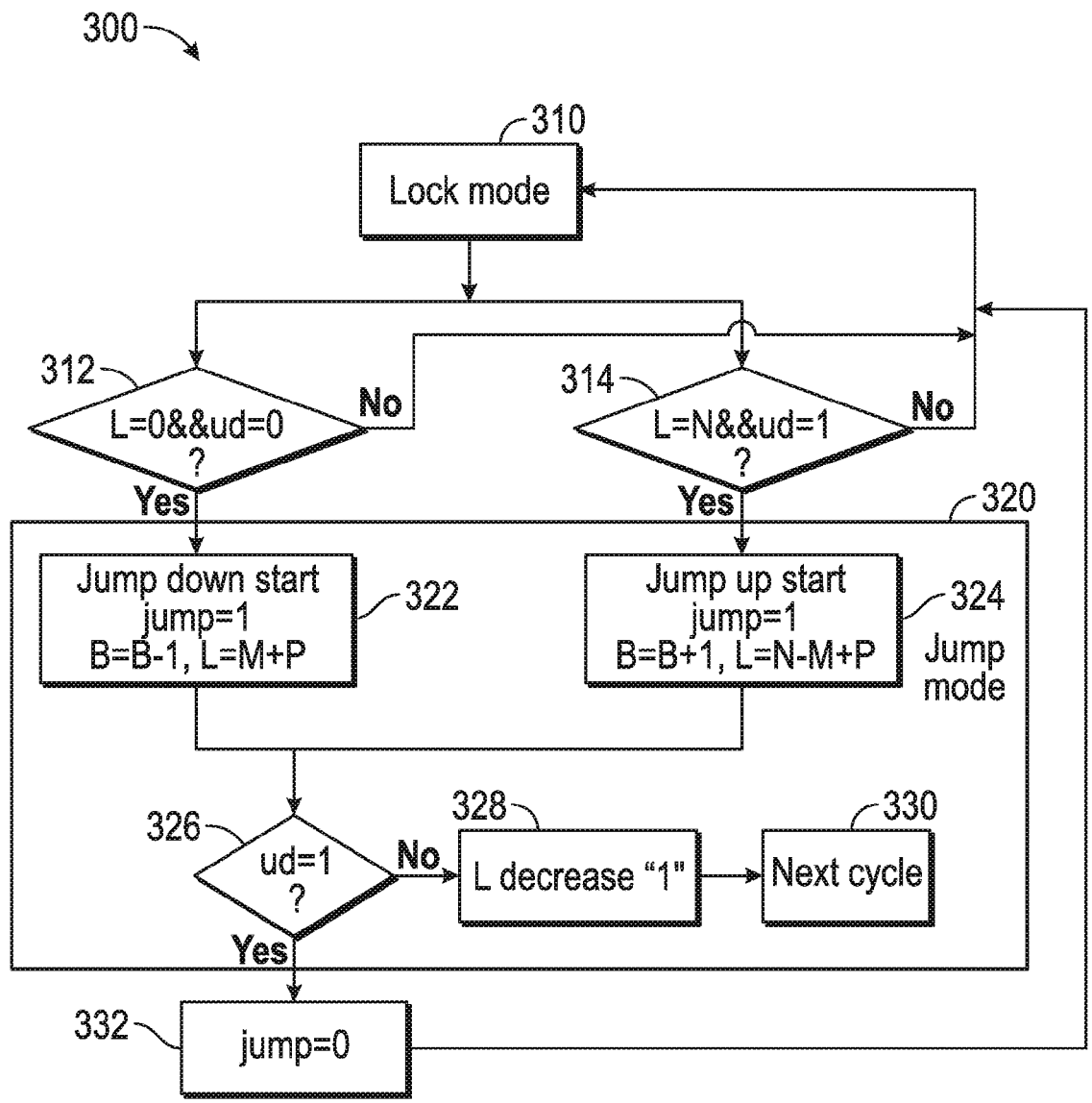
FIG. 8 is a flow chart illustrating a frequency jump control method employed in the PLL control system in accordance with the disclosed embodiments.

FIG. 8 is a flow chart illustrating a frequency jump control method that is performed by the DCO control signal generator 130 and the frequency band jump control module 135 of the PLL control system in accordance with the disclosed embodiments. The processing 300 illustrated in FIG. 8 begins at 310 when the PLL control system 100 is operating in lock mode 310. Block 320 represents operation of the frequency-band jump controller module 135 in frequency-band jump mode.

Frequency-Band Jump Mode

At 312 and 314, the frequency-band jump controller module 135 determines whether the value (L) of the first digital control signal 140 has reached either: a minimum value (L=0) and has continued to decrease (ud=0) (at 312); or a maximum value (L=N) and has continued to increase (ud=1) (at 314). When the value (L) first digital control signal 140 is not equal to the minimum value (L=0) or the maximum value (L=N), the processing 300 loops back to 310. Thus, the transition from lock mode to frequency-band jump mode can be triggered, for example, when the value (L) of first digital control signal 140 has reached either the minimum value (L=0) and continues to decrease (ud=0), or the maximum value (L=N) and continues to increase (ud=1). When the transition from lock mode to frequency-band jump mode occurs, during the first cycle of the 120, the frequency-band jump controller module 135 generates a value of the frequency band jump signal 152 that either: decreases (at 322) the number (B) of delay cells by one and increases the number (L) of load cells by a certain number (M+P), or increases (at 324) the number (B) of delay cells by one and decreases the number (L) of load cells by a certain number (N−M+P). This way the total loop delay will only undergo a very small change, each cycle time of the high-frequency clock signal (dco_out) 160 will be larger than the expected cycle time of the high-frequency clock signal (dco_out) 160, and the PLL can be kept in lock mode despite the decrease or increase.

At 312, the frequency-band jump controller module 135 determines whether the value (L) of the first digital control signal 140 is equal to zero (0) and continues to decrease (ud=0). When the value (L) of the first digital control signal 140 is equal to zero (at 312) and continues to decrease (ud=0), the processing 300 proceeds to 322.

At 322, the value of the frequency band jump signal 152 is set high (equal to logical one (1)), which causes the value (B) of the second digital control signal 150 to be decremented by one (B=B−1), and the value (L) of the first digital control signal 140 to be set equal to the sum of M and P (L=M+P). In other words, in the first cycle of second clock signal (clk2r) 120, if the value (L) of the first digital control signal 140 is equal to zero (0) and continues to decrease, then the value of B will decrease 1, and at the same time L will be increased to M+P, where M is the equalized number of load cells for one delay cell, and P is an additional margin. Thus, when the value (B) of the second digital control signal 150 is decremented by one (B=B−1), the new L value will be adjusted to M+P. As such, the frequency-band jump controller module 135 generates a value of the frequency band jump signal 152 that will decrease the value of B decreases by 1, increase the value of L to be larger or smaller by adding a margin P so that each cycle time of the high-frequency clock signal (dco_out) 160 is larger than the expected cycle time of the high-frequency clock signal (dco_out) 160.

At 314, the frequency-band jump controller module 135 determines whether the value (L) of the first digital control signal 140 is equal to N and continues to increase (ud=1). When the frequency-band jump controller module 135 determines that the value (L) of the first digital control signal 140 is not equal to N, the processing 300 loops back to 310.

When value (L) of the first digital control signal 140 is equal to N and continues to increase (ud=1), the processing 300 proceeds to 324 of block 320. At 324, the value of the frequency band jump signal 152 generated by the frequency-band jump controller module 135 is set low (logical zero (0)), which causes the value (B) of the second digital control signal 150 to be incremented by one (B=B+1) and the value (L) of the first digital control signal 140 to be set equal to N minus M plus P (L=N−M+P). In other words, when the value of the second digital control signal 150 is incremented by one (B=B+1), the new L value will be adjusted to N−M+P. Thus, during the frequency band jump, in the first cycle of second clock signal (clk2r) 120, if the value (L) of the first digital control signal 140 is equal to N, then the value of B will increase 1, and at the same time L will be decreased to a value of N−M+P, where M is the equalized number of load cells for one delay cell, and P is an additional margin. As such, the frequency-band jump controller module 135 will generate a value of the frequency band jump signal 152 that increases the value of B by 1, and decreases the value of L to be larger or smaller by adding a margin P so that each cycle time of the high-frequency clock signal (dco_out) 160 is larger than the expected cycle time of the high-frequency clock signal (dco_out) 160.

In the following cycle of the second clock signal (clk2r) 120, the DCO 155 will oscillate with a little bit lower frequency than needed to meet the expected cycle time (so that it will not have impact on the function of the circuit that uses the high-frequency clock signal (dco_out) 160). Following blocks 322 and 324 the processing 300 proceeds to 326.

At 326, the frequency-band jump controller module 135 determines whether the lead/lag detection result (UD) signal 127 is high (logical one (1). The lead/lag detection result (UD) signal 127 indicates whether the feedback clock signal (clkf) 180 leads or lags the second clock signal (clk2r) 120.

When the frequency-band jump controller module 135 determines (at 326) that the lead/lag detection result (UD) signal 127 is low (logical zero (0)), the processing 300 proceeds to 328, where the frequency-band jump controller module 135 decreases the value (L) of the first digital control signal 140 by one in the next cycle of second clock signal (clk2r) 120. At 330, the frequency-band jump controller module 135 waits for the next cycle of the second clock signal (clk2r) 120. The processing 300 then loops back to 326, where the frequency-band jump controller module 135 once again determines whether the lead/lag detection result (UD) signal is high (logical one (1)).

The processing at 328 and 330 repeats until the frequency-band jump controller module 135 determines (at 326) that the lead/lag detection result (UD) signal 127 is high (logical one (1), at which point the frequency band jump is finished. The processing 300 proceeds to 332, where the frequency-band jump controller module 135 sets the frequency band jump signal 152 low (logical zero), and loops back to 310 where the PLL resumes regular lock mode.

Figure 9:
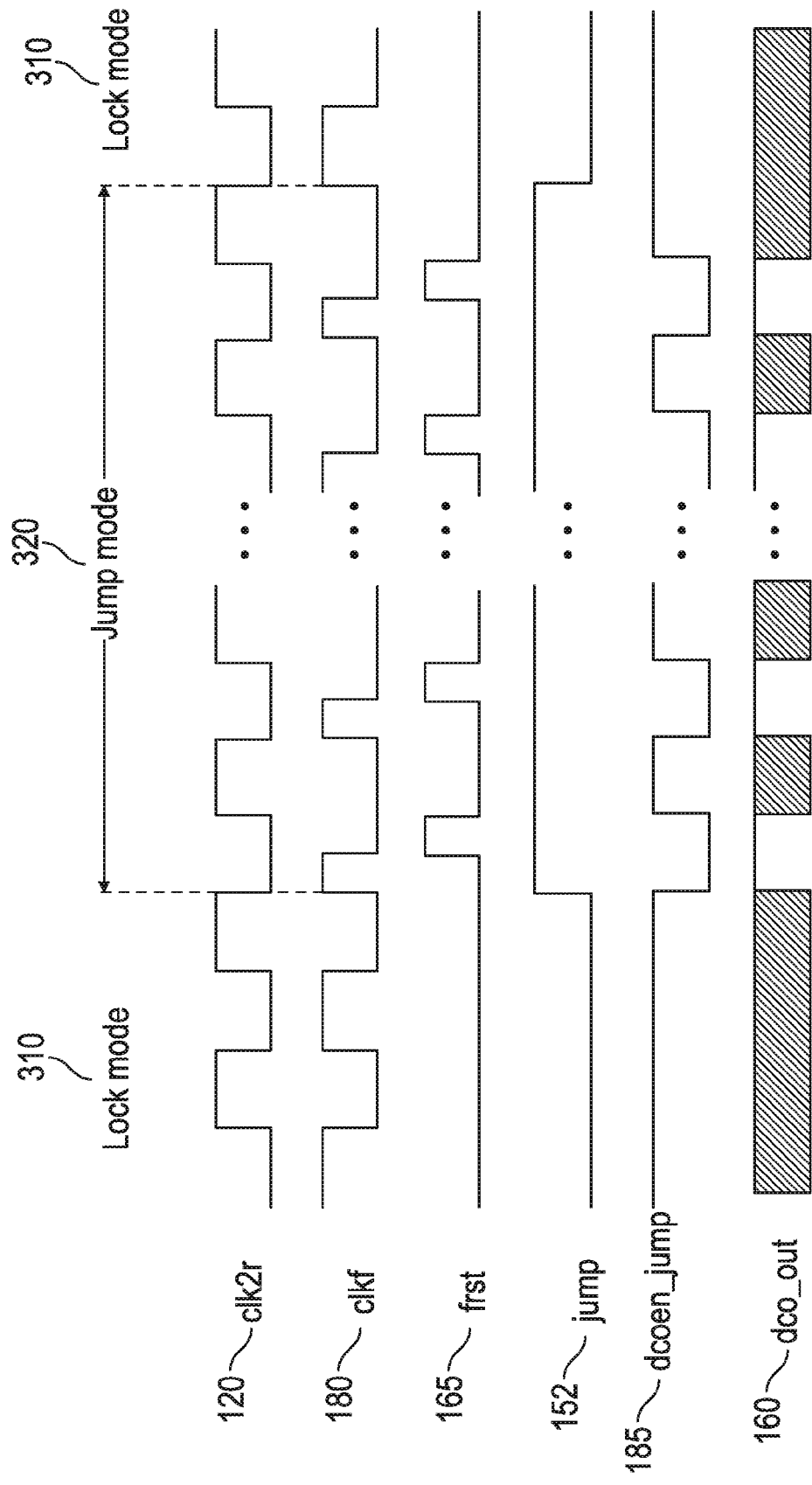
FIG. 9 is a timing diagram illustrating a clock signal (clk2r), a feedback clock signal (clkf), a reset signal (frst), a frequency band jump signal, a DCO enable signal (dcoen_jump) and a high-frequency clock signal (dco_out) in accordance with the disclosed embodiments.

FIG. 9 is a timing diagram illustrating a clock signal (clk2r) 120, a feedback clock signal (clkf) 180, a reset signal (frst) 165, a frequency band jump signal 152, a DCO enable signal (dcoen_jump) 185 and a high-frequency clock signal (dco_out) 160 in accordance with the disclosed embodiments. FIG. 9 illustrates how these signals transition during lock mode 310 and frequency-band jump mode 320.

In normal lock mode 310, the DCO enable signal (dcoen_jump) 185 stays high (logic one (1)) and the DCO 155 keeps oscillating continuously (as indicated by the dark region of the high-frequency clock signal (dco_out) 160). The DCO enable signal (dcoen_jump) 185 is set low (logic 0) to reset the DCO loop (FIG. 5) and enable the DCO 155 to operate in frequency-band jump mode 320 and the frequency band jump signal 152 goes high (logic one (1)).

The DCO 155 keeps oscillating until the synchronous high-speed counter 170 counts to PLL feedback divide number (DF) 175, at which point feedback clock signal (clkf) 180 goes high (to logic 1) and the DCO enable signal (dcoen_jump) 185 is set low (to logic 0) (immediately before the next falling edge of the high-frequency clock signal (dco_out) 160) to make the DCO 155 stop oscillating while the last cycle of the high-frequency clock signal (dco_out) 160 completes. This helps to ensure that the actual cycle time during each cycle of the high-frequency clock signal (dco_out) 160 is larger than the expected cycle time of the high-frequency clock signal (dco_out) 160 without impacting functioning of the application that uses the high-frequency clock signal (dco_out) 160.

When the first rising edge of high-frequency clock signal (dco_out) 160 arrives, the synchronous high-speed counter 170 and the feedback clock signal (clkf) 180 will be reset.

After the rising edge of the second clock signal (clk2r) 120, the DCO enable signal (dcoen_jump) 185 switches high (logical one (1)) and the DCO 155 starts oscillating again.

Figure 10:
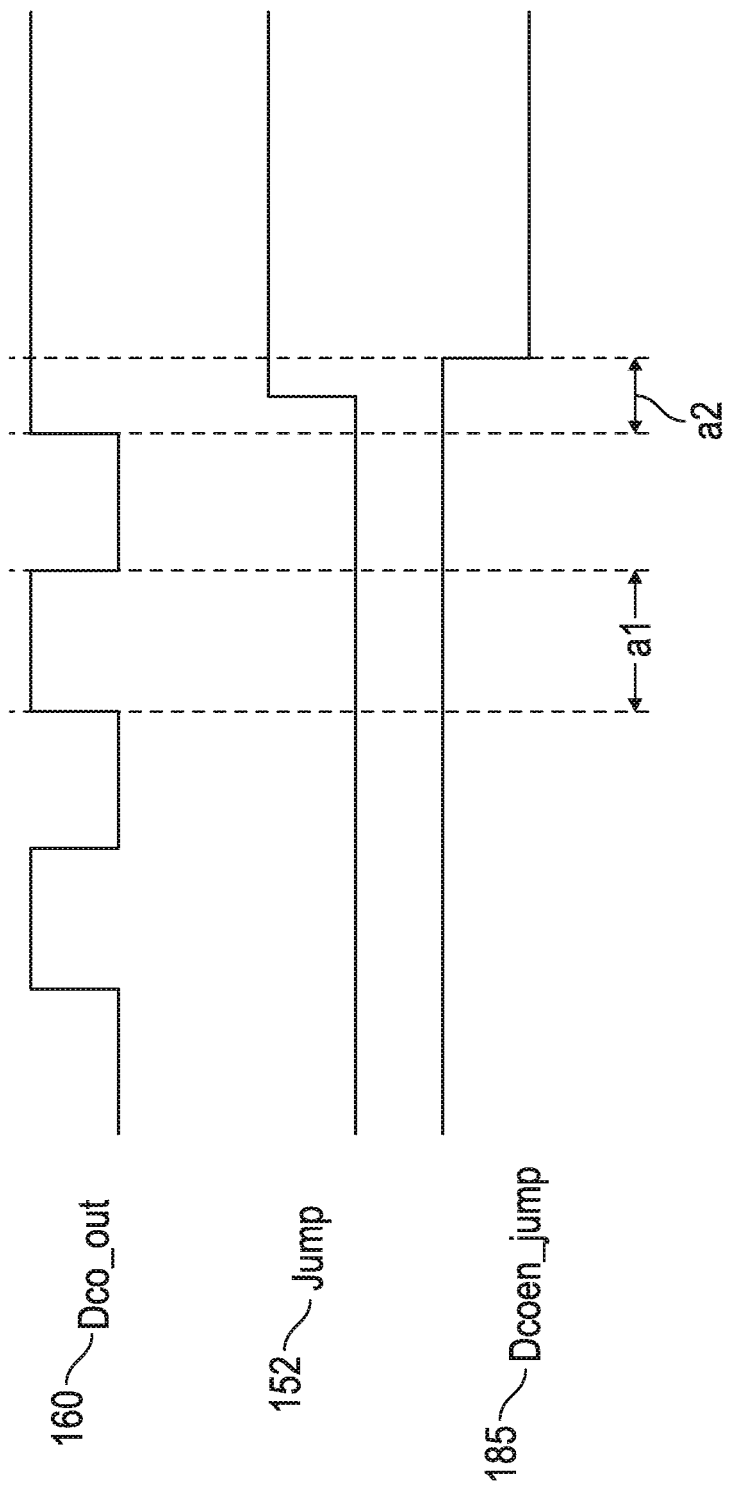
FIG. 10 is a timing diagram illustrating the high-frequency clock signal (dco_out), and the transitions of the frequency band jump signal and the DCO enable signal (dcoen_jump) of FIG. 9 in accordance with the disclosed embodiments.

FIG. 10 is a timing diagram illustrating the high-frequency clock signal (dco_out) 160, and the transitions of the frequency band jump signal 152 and the DCO enable signal (dcoen_jump) 185 of FIG. 9 in accordance with the disclosed embodiments. The clock pulse width of the high-frequency clock signal (dco_out) 160 is a1. Frequency-band jump mode 320 will be triggered by the rising edge of high-frequency clock signal (dco_out) 160 when "L" achieves the maximum or minimum value. At the same time, thethe DCO enable signal (dcoen_jump) 185 will be disabled immediately. The delay from the last rising edge of high-frequency clock signal (dco_out) 160 to falling edge of the DCO enable signal (dcoen_jump) 185 is a2. To make sure the high-frequency clock signal (dco_out) 160 is not toggling any more after the last rising edge, a2 should be smaller than a1.

Figure 11:
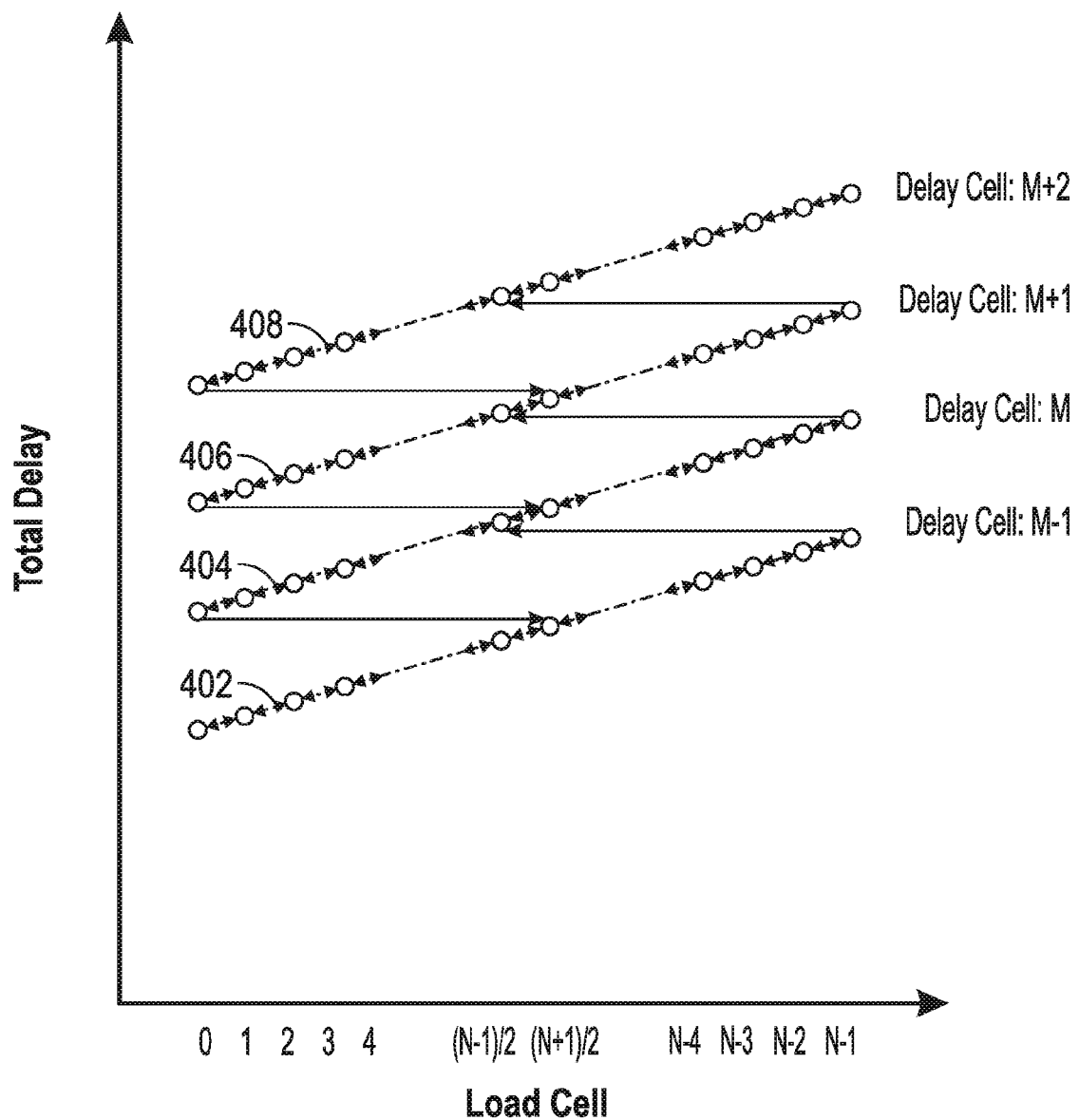
FIG. 11 is a series of graphs in accordance with the disclosed embodiments.

FIG. 11 is a series of graphs 402 . . . 408 in accordance with the disclosed embodiments. Each graph is representative of operation in a particular frequency band and plots total delay of the DCO loop (FIG. 5) as a function of number (L) of load cells 220 that are switched on and as the number (B) of delay cells 240-0 . . . 240-31 in the delay cell chain 240 varies. More specifically, each of the different graphs in FIG. 11 represents a different number (B) of delay cells being activated, and each circular dot on each graph illustrates how the total delay changes as the number (L) of load cells increases or decreases. A transition from one graph to another graph occurs when the frequency band jump control module 135 commands a jump from one frequency band to another frequency band.

As mentioned above, when a conventional PLL operates in lock mode, the number (B) of delay cells will not change, and only the number (L) of load cells will be adjusted. As such, the adjustments are constrained to a single frequency band (i.e., only occur on a single line or graph of FIG. 11).

However, in accordance with the disclosed embodiments, the number (L) of load cells is also adjusted. As explained above, when the adjustment of the number (L) of load cells (that are switched on) reaches either a lower limit (0) and continues to decrease (ud=0) or an upper limit (N) and continues to increase (ud=1), the DCO 155 will jump to another line or graph of FIG. 11 other than the one it is operating on. For any particular graph, when the number (L) of load cells has reached a minimum value (zero) and continues to decrease (ud=0), this triggers a jump to the middle of the graph that is immediately below it. Likewise, for any particular graph, when the number (L) of load cells has reached a maximum value (N) and continues to increase (ud=1), this triggers a jump to the middle point of the graph that is immediately above it.

CONCLUSION

The methods and systems in accordance with the disclosed embodiments can be used when the digital PLL is operating in lock mode to adjust number (B) of delay cells that are active in the delay loop of the DCO and to adjust the number (L) of load cells that are switched on in the DCO. The discosed embodiments allow the digital PLL to maintain lock status when frequency is adjusted over a wide range (after reaching lock status) even when other operating characteristics, such as supply voltage and operating temperature, vary over a large range. As a result, the digital PLL exhibits a larger tolerance for changes in temprature and variations in supply voltage when it is operating in lock mode. In addition, each output clock cycle time is larger than the expected cycle time and can have a minimum period such that there is no impact with respect to the functioning of the application that consumes the output clock.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A phase locked loop (PLL) control system, comprising:
a digital controlled oscillator (DCO) comprising:
   a delay cell chain comprising a number (B) of delay cells;
   a load control cell comprising a number (L) of load cells; and
a module configured to:
   dynamically adjust, when the PLL control system is operating in a lock mode, the number (B) of delay cells that are activated and part of the delay cell chain and the number (L) of load cells that are switched on to control an amount of delay in the DCO.

2. The PLL control system of claim 1, further comprising:
a reference clock divider configured to: receive a reference clock signal; and generate a second clock signal;
a synchronous high-speed counter configured to: receive a frequency band jump signal, a PLL feedback divide number, a reset signal (frst) that resets the synchronous high-speed counter, and a high-frequency clock signal from the DCO; and generate a feedback clock signal and a DCO enable signal; and
lead/lag determination circuitry configured to receive the second clock signal and the feedback clock signal, and generate a lead/lag detection result that indicates whether the feedback clock signal leads or lags the second clock signal.

3. The PLL control system of claim 2, wherein the module comprises:
a frequency-band jump controller module configured to:
   receive the second clock signal, the feedback clock signal, the lead/lag detection result, a first digital control signal, and a second digital control signal; and
   when a value (L) of the first digital control signal has reached a minimum value and has continued to decrease, or when the value (L) of the first digital control signal has reached a maximum value and has continued to increase: generate a frequency band jump signal to transition the DCO from operating in the lock mode to operating in a frequency-band jump mode; and
a DCO control signal generator configured to:
   process the second clock signal, the lead/lag detection result and the frequency band jump signal to dynamically adjust:
      the value (L) of the first digital control signal to control the number (L) of load cells that are switched on to control an amount of delay of the DCO, and
      a value of the second digital control signal to control the number (B) of delay cells that are active and part of the delay cell chain.

4. The PLL control system of claim 3, wherein the DCO is further configured to:
receive the first digital control signal, the second digital control signal and the DCO enable signal; and
generate the high-frequency clock signal based on the first digital control signal and the second digital control signal.

5. The PLL control system of claim 4, wherein the frequency-band jump controller module is further configured to:
generate the frequency band jump signal that is supplied to the DCO control signal generator and the synchronous high-speed counter, wherein the frequency band jump signal switches between a logic high value and a logic low value, and
wherein the frequency band jump signal has the logic low value when the digital PLL is operating in the lock mode and switches to the logic high value when the digital PLL starts operating in the frequency-band jump mode.

6. The PLL control system of claim 1, wherein the DCO keeps oscillating continuously in the lock mode when the signal DCO enable signal stays at a logic high value until the synchronous high-speed counter counts to PLL feedback divide number, and
wherein the frequency-band jump mode starts when the frequency band jump signal switches to the logic high value, at which point the feedback clock signal switches to a logic high value, and the DCO enable signal transitions to a logic low value immediately before the next falling edge of the high-frequency clock signal to make the DCO stop oscillating while a last cycle of the high-frequency clock signal completes to ensure that the actual cycle time during each cycle of the high-frequency clock signal is larger than the expected cycle time of the high-frequency clock signal.

7. The PLL control system of claim 6, wherein the synchronous high-speed counter and the feedback clock signal are reset when the first rising edge of high-frequency clock signal arrives.

8. The PLL control system of claim 7, wherein the DCO enable signal switches to a logic high value after the rising edge of the second clock signal and the DCO restarts oscillating.

9. The PLL control system of claim 3, when the transition from the lock mode to a frequency-band jump mode occurs, wherein the frequency-band jump controller module is further configured to generate the frequency band jump signal that will cause the DCO control signal generator to either:
decrease the number (B) of delay cells by one and increase the number (L) of load cells by a certain number during a first cycle of the second clock signal when the frequency-band jump controller module determines that the value (L) of the first digital control signal is equal to the minimum value and has continued to decrease; or
increase the number (B) of delay cells by one and decrease the number (L) of load cells by another certain number during the first cycle of the second clock signal when the frequency-band jump controller module determines that the value (L) of the first digital control signal is equal to the maximum value (N) and continues to increase.

10. The PLL control system of claim 9, wherein a value (N) designates the total number of load cells in the DCO, the value (L) of the first digital control signal designates the number of the load cells in the DCO that are switched on during any particular cycle, a value (M) designates an equalized number of load cells that have a delay equivalent to one delay cell, a value (P) is an additional margin that is added to the adjustment of the value (L) so that each cycle time of the high-frequency clock signal is larger than the expected cycle time of the high-frequency clock signal, and when the frequency-band jump controller module determines that the value (L) of the first digital control signal is equal to zero, wherein the frequency-band jump controller module is further configured to:
  set the value of the frequency band jump signal to a logic high value to cause the DCO to jump down one frequency band;
  decrement a value (B) of the second digital control signal by one; and
  increase the value (L) of the first digital control signal equal to the sum of M and P so that each cycle time of the high-frequency clock signal is larger than the expected cycle time of the high-frequency clock signal.

11. The PLL control system of claim 10, when the frequency-band jump controller module determines that the value (L) of the first digital control signal is equal to the maximum value (N) and has continued to decrease, wherein the frequency-band jump controller module is further configured to:
  set the value of the frequency band jump signal to a logic high value to cause the DCO to jump up by one frequency band;
  increment the value (B) of the second digital control signal by one; and
  decrease the value (L) of the first digital control signal by setting the value (L) equal to N minus M plus P so that each cycle time of the high-frequency clock signal is larger than the expected cycle time of the high-frequency clock signal.

12. The PLL control system of claim 11, wherein during a next cycle of the second clock signal that follows the first cycle of the of second clock signal, the frequency-band jump controller module is further configured to:
  determine whether the lead/lag detection result signal has a logic high value.

13. The PLL control system of claim 12, wherein the frequency-band jump controller module is further configured to:
  decrease the value (L) of the first digital control signal by one when the frequency-band jump controller module determines that the lead/lag detection result signal is at a logic low value.

14. The PLL control system of claim 13, wherein the frequency-band jump controller module is further configured to:
  repeat decreasing the value (L) of the first digital control signal by one until the frequency-band jump controller module determines that the lead/lag detection result signal is set to a logic high value, at which point the frequency-band jump controller module sets the jump signal to a logic low value before the PLL resumes regular lock mode.

15. A method for controlling operation of a phase locked loop (PLL) control system that includes a digital controlled oscillator (DCO) comprising: a delay cell chain comprising a number (B) of delay cells; and a load control cell comprising a number (L) of load cells, the method comprising:
  dynamically adjusting, when the PLL control system is operating in lock mode, the number (B) of delay cells that are activated and part of the delay cell chain and the number (L) of load cells that are switched on to control an amount of delay in the DCO.

16. The method of claim 15, further comprising:
  generating a second clock signal based on a reference clock signal;
  generating, based on a PLL feedback divide number and a high-frequency clock signal from the DCO, a feedback clock signal;
  when a value (L) of a first digital control signal has reached a minimum value and has continued to decrease, or when the value (L) of the first digital control signal has reached a maximum value and has continued to increase: generating a frequency band jump signal and a DCO enable signal to transition the DCO from operating in the lock mode to operating in a frequency-band jump mode; and
  wherein the step of dynamically adjusting comprises:
  processing the second clock signal, a lead/lag detection result signal that indicates whether a feedback clock signal leads or lags the second clock signal and the frequency band jump signal to dynamically adjust:
    the value (L) of the first digital control signal to control the number (L) of load cells that are switched on to control an amount of delay of the DCO, and
    a value of the second digital control signal to control the number (B) of delay cells that are active and part of the delay cell chain.

17. The method of claim 16, further comprising:
  generating the high-frequency clock signal based on the first digital control signal and the second digital control signal,
  wherein the number (B) of delay cells that are active in a delay loop of the DCO is dynamically adjusted in response to the second digital control signal, and
  wherein the number (L) of load cells that are switched on is dynamically adjusted in response to the first digital control signal when the number (L) of load cells reaches a threshold to jump to an adjacent frequency band.

18. The method of claim 17, wherein the frequency band jump signal switches between a logic high value and a logic low value and switches to the logic high value when the frequency-band jump mode starts.

19. A phase locked loop (PLL) control system, comprising:
  a digital controlled oscillator (DCO) comprising:
    a delay cell chain comprising a number (B) of delay cells; and
    a load control cell comprising a number (L) of load cells;
  a frequency-band jump controller module configured to:
    receive a second clock signal, a feedback clock signal, a lead/lag detection result that indicates whether the feedback clock signal leads or lags the second clock signal, a first digital control signal, and a second digital control signal;
    when a value (L) of the first digital control signal has reached a minimum value and has continued to decrease, or when the value (L) of the first digital control signal has reached a maximum value and has continued to increase: generate a frequency band jump signal to transition the DCO from operating in a lock mode to operating in a frequency-band jump mode; and
  a DCO control signal generator configured to:
    process the second clock signal, the lead/lag detection result and the frequency band jump signal to dynamically adjust:

the value (L) of the first digital control signal to control the number (L) of load cells that are switched on to control an amount of delay in the DCO, and a value (B) of the second digital control signal to control the number (B) of delay cells that are active and part of the delay cell chain.

\* \* \* \* \*